(12) United States Patent
Ding

(10) Patent No.: US 11,145,840 B2
(45) Date of Patent: Oct. 12, 2021

(54) DISPLAY SCREEN ASSEMBLY STRUCTURE

(71) Applicant: Wuhan China Star Optoelectronics Semiconductor Display Technology Co., Ltd., Wuhan (CN)

(72) Inventor: Feng Ding, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/493,310

(22) PCT Filed: Mar. 12, 2019

(86) PCT No.: PCT/CN2019/077812
§ 371 (c)(1),
(2) Date: Sep. 12, 2019

(87) PCT Pub. No.: WO2020/124806
PCT Pub. Date: Jun. 25, 2020

(65) Prior Publication Data
US 2020/0194715 A1    Jun. 18, 2020

(30) Foreign Application Priority Data
Dec. 18, 2018 (CN) .......................... 201811551060.7

(51) Int. Cl.
*H01L 51/52* (2006.01)
*F16F 15/02* (2006.01)
*F16F 13/00* (2006.01)
*H01L 27/32* (2006.01)
*H01L 51/00* (2006.01)

(52) U.S. Cl.
CPC ........ *H01L 51/5246* (2013.01); *F16F 13/002* (2013.01); *F16F 15/022* (2013.01); *F16F 2224/04* (2013.01); *H01L 27/322* (2013.01); *H01L 51/0097* (2013.01); *H01L 2251/5338* (2013.01)

(58) Field of Classification Search
CPC ............... H01L 51/5246; H01L 27/322; H01L 51/0097; H01L 2251/5338; F16F 13/002; F16F 15/022; F16F 2224/04
See application file for complete search history.

(56) References Cited

U.S. PATENT DOCUMENTS 9,596,914 B2 * 3/2017 Zaloom ................ G06F 1/1613

FOREIGN PATENT DOCUMENTS

CN            207651116      *   7/2018   ............... G09F 9/35

* cited by examiner

*Primary Examiner* — James Wu
*Assistant Examiner* — Hung Q Dang

(57) ABSTRACT

A display screen assembly structure is provided. The display screen assembly structure includes a display screen body, a display screen holder, a display screen placement board, a buffer chamfer, and a fluid buffer member. The detachable connection between the display screen placement board and the display screen holder facilitates to rapidly disassemble and install the display screen body, and the fluid buffer member disposed in the buffer chamfer and a cushion disposed on a side of the display screen holder can provide buffer effect and protect the display screen body, so as to increase the protection capability of the display screen.

19 Claims, 3 Drawing Sheets

DISPLAY SCREEN ASSEMBLY STRUCTURE

RELATED APPLICATIONS

This application is a National Phase of PCT Patent Application No. PCT/CN2019/077812 having International filing date of Mar. 12, 2019, which claims the benefit of priority of Chinese Patent Application No. 201811551060.7 filed on Dec. 18, 2018. The contents of the above applications are all incorporated by reference as if fully set forth herein in their entirety.

FIELD AND BACKGROUND OF THE INVENTION

The present invention relates to a display screen assembly structure, and more particularly to a flexible organic light emitting diode (OLED) display screen assembly structure.

In recent years, as development of flexible screen technology, applications of flexible organic light emitting diode (OLED) display screen have become more and more popular. An OLED display screen is a display screen that utilizes a plurality of organic light-emitting diodes. Because an organic light emitting diode is self-illuminating, it does not require a backlight source, and has excellent characteristics such as higher contrast, thinner thickness, wide viewing angles, fast response times, flexibility, wide temperature ranges, simple structure and simple process, and it is considered to be an emerging application technology for next-generation flat panel displays. However, commercial OLED display screens are not only complicated in structure, but also have poor function, and the OLED display screens are not provided with protection at their four corners. As a result, when an OLED display screen falls to the floor, the OLED display screen is prone to breakage or damage because there is a large impact force generated at the corners when the corners ground. Moreover, existing OLED display screens require to disassemble and install through professionals, the required maintenance time is long, and the maintenance cost is high. In addition, because the maintenance level of professional maintenance staff is different, and the maintenance of the OLED display screen is more difficult, it is easy to cause a problem that maintenance effectiveness of the display screens is not well.

TECHNICAL PROBLEM

The OLED display screens are not provided with protection at their four corners. As a result, when an OLED display screen falls to the floor, the OLED display screen is prone to breakage or damage because there is a large impact force generated at the corners when the corners ground. Moreover, existing OLED display screens require to disassemble and install through professional maintenance staff, the required maintenance time is long, and the maintenance cost is high. In addition, because the maintenance level of professional maintenance staff is different, and the maintenance of the OLED display screen is more difficult, it is easy to cause a problem that maintenance effectiveness of the display screens is not well.

Therefore, it is necessary to provide a display screen assembly structure to solve the problems existing in the conventional art.

SUMMARY OF THE INVENTION

In view of above, the present invention provides a display screen assembly structure to solve a problem that an OLED display screen falls to the floor, the OLED display screen is prone to breakage or damage because there is a large impact force generated at the corners when the corners ground.

The main purpose of the present invention is to provide a display screen assembly structure, which can provide a buffer to a display screen body to increase the protection capability of the display screen.

A secondary object of the present invention is to provide a display screen assembly structure that allows the display screen to easily disassemble and install, to reduce the required disassembly and installation time, reduce maintenance costs, and reduce maintenance difficulty.

In order to achieve the foregoing object of the present invention, an embodiment of the present invention provides a display screen assembly structure, including:
 a display screen body;
 a display screen holder detachably disposed around the display screen body;
 a display screen placement board detachably attached to the display screen holder, and configured to dispose the display screen body thereon;
 a buffer chamfer formed in a sidewall of the display screen holder;
 a fluid buffer member fixedly attached to an inner wall of the buffer chamfer,
 wherein two inner walls of the fluid buffering member are symmetrically attached to two dispersing plates, one side of the two dispersing plates is attached to a fixed strut; and a buffer spring is detachably mounted on an outer side of the fixed strut,
 a fixture slot formed in a side surface of the display screen holder attached to the display screen placement board, wherein the display screen placement board is detachably attached to the fixture slot by a fixture block; and a cushion attached to an outer side of the display screen holder.

In an embodiment of the present invention, the display screen assembly further includes: a connection holder fixedly attached to a bottom of the display screen body, wherein the connection holder has a first base and a second base connected to each other by a connecting member; and an elastic member connecting the connection holder with the display screen holder.

In an embodiment of the present invention, the display screen assembly structure further includes:
 a limiting block fixedly attached to the display screen holder; and
 a sealing gasket disposed between the display screen placement board and the limiting block, and detachably attached to the limiting block.

In an embodiment of the present invention, a diameter of the fixed strut is less than an inner diameter of the buffer spring.

In an embodiment of the present invention, the other side surface of the display screen holder is provided with a waterproof rubber pad.

Moreover, another embodiment of the present invention provides a display screen assembly structure, including: a display screen body; a display screen holder detachably disposed around the display screen body; a display screen placement board detachably attached to the display screen holder, and configured to dispose the display screen body thereon; a buffer chamfer formed in a sidewall of the display screen holder; and a fluid buffer member fixedly attached to an inner wall of the buffer chamfer, In an embodiment of the present invention, two inner walls of the fluid buffering member are symmetrically attached to two dispersing plates, one side of the two dispersing plates is attached to a fixed strut; and a buffer spring is detachably mounted on an outer side of the fixed strut, In an embodiment of the present invention, a fixture slot is formed in a side surface of the display screen holder attached to the display screen placement board, and the display screen placement board is detachably attached to the fixture slot by a fixture block removably fitting into the fixture slot; and a cushion is attached to an outer side of the display screen holder.

In an embodiment of the present invention, the display screen assembly further includes: a connection holder fixedly attached to a bottom of the display screen body, wherein the connection holder has a first base and a second base connected to each other by a connecting member; and an elastic member connecting the connection holder with the display screen holder.

In an embodiment of the present invention, the display screen assembly structure further includes: a limiting block fixedly attached to the display screen holder; and a sealing gasket disposed between the display screen placement board and the limiting block, and detachably attached to the limiting block.

In an embodiment of the present invention, a diameter of the fixed strut is less than an inner diameter of the buffer spring.

In an embodiment of the present invention, the display screen assembly structure further includes: a rubber pad covering an outer side of the display screen placement board.

In an embodiment of the present invention, the other side surface of the display screen holder is provided with a waterproof rubber pad.

In an embodiment of the present invention, an internal accommodating space of the fluid buffer member is filled with helium gas.

Furthermore, another embodiment of the present invention further provides a display screen assembly structure, including:

a display screen holder detachably attached to a display screen placement board;

a buffer chamfer formed in a sidewall of the display screen holder;

a fluid buffer member fixedly attached to an inner wall of the buffer chamfer; and a plurality of connection holders connected to each other by an elastic member, wherein the connecting holder has a first base and a second base connected to each other by a connecting member.

In an embodiment of the present invention, two inner walls of the fluid buffering member are symmetrically attached to two dispersing plates, one side of the two dispersing plates is attached to a fixed strut; and a buffer spring is detachably mounted on an outer side of the fixed strut.

In an embodiment of the present invention, a fixture slot is formed in a side surface of the display screen holder attached to the display screen placement board, and the display screen placement board is detachably attached to the fixture slot by a fixture block removably fitting into the fixture slot; and a cushion is detachably attached to an outer side of the display screen holder.

In an embodiment of the present invention, the display screen assembly structure further includes:

a limiting block fixedly attached to the display screen holder; and a sealing gasket disposed between the display screen placement board and the limiting block, and detachably attached to the limiting block.

In an embodiment of the present invention, the display screen assembly structure further includes: a rubber pad covering an outer side of the display screen placement board.

In an embodiment of the present invention, the other side surface of the display screen holder is provided with a waterproof rubber pad.

BENEFICIAL EFFECT

Compared with the conventional art, the present invention provides that the display screen placement board is detachably connected to the display screen holder, and using a connection holder fixedly attached to the display screen body, facilitating to rapidly disassemble and install of the display screen body, and by providing a fluid buffer member fixedly attached to inside of the buffer chamfer and a cushion attached to a side of the display screen holder, the display screen body can be provided with a buffer protection, so as to increase the protection capability of the display screen. This not only improves the impact resistance of the display screen body, so as to increase the protection capability of the display screen, it also makes the display screen easy to disassemble and install, so as to reduce required disassembly and installation time, reduce maintenance costs, and reduce maintenance difficulty.

BRIEF DESCRIPTION OF THE SEVERAL VIEWS OF THE DRAWINGS

In order to make the above description of the present invention more comprehensible, the preferred embodiments are described below, and in conjunction with the accompanying drawings, the detailed description is as follows.

DETAILED DESCRIPTION OF SPECIFIC EMBODIMENTS OF THE INVENTION

The following description of the various embodiments is provided to illustrate the specific embodiments of the invention. Furthermore, the directional terms mentioned in the present invention, such as upper, lower, top, bottom, front, rear, left, right, inner, outer, side, surrounding, central, horizontal, horizontal, vertical, longitudinal, axial, radial, uppermost or lowermost, etc., only refer to the direction of the additional schema. Therefore, the directional terminology used is for the purpose of illustration and understanding of the invention.

Figure 1:
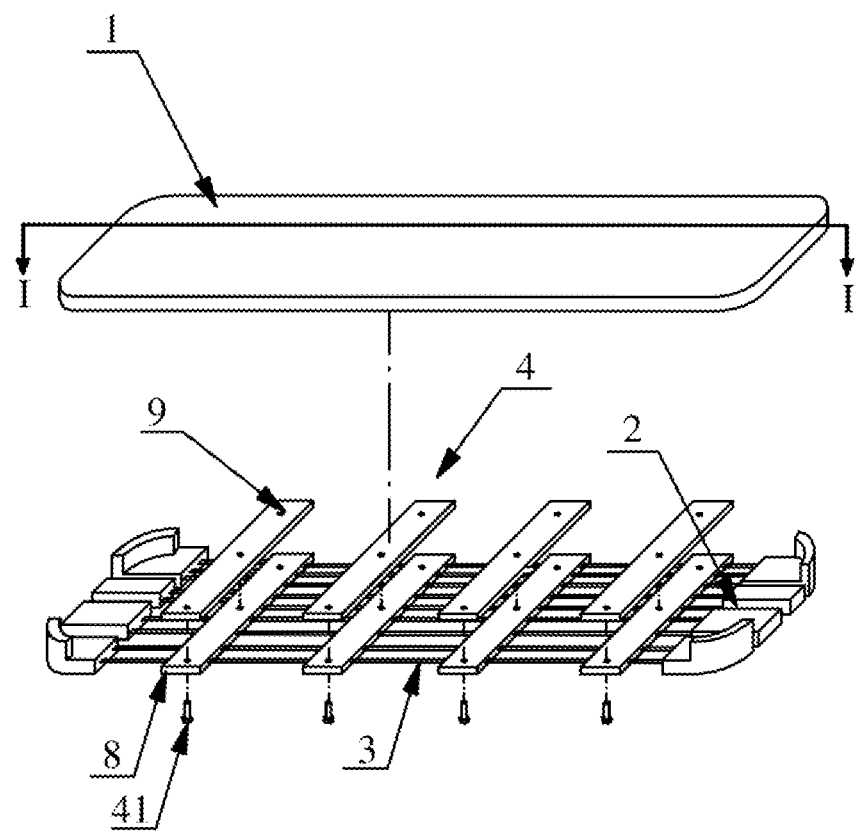
FIG. 1 is an exploded schematic view of a display screen assembly structure according to an embodiment of the present invention.

Please refer to FIG. 1, a display screen assembly structure according to an embodiment of the present invention includes: a display screen body 1; a display screen holder 2 detachably disposed around the display screen body; a display screen placement board 10, detachably attached to the display screen holder 2, and configured to dispose the display screen body 1; a buffer chamfer 14 formed in a sidewall of the display screen holder 2; and a fluid buffer member 15 fixedly attached to an inner wall of the buffer chamfer 14.

The detailed construction, assembly relationship, and operation principle of the above-described respective elements in the embodiment will be described in detail below with reference to FIGS. 1-3.

Figure 2:
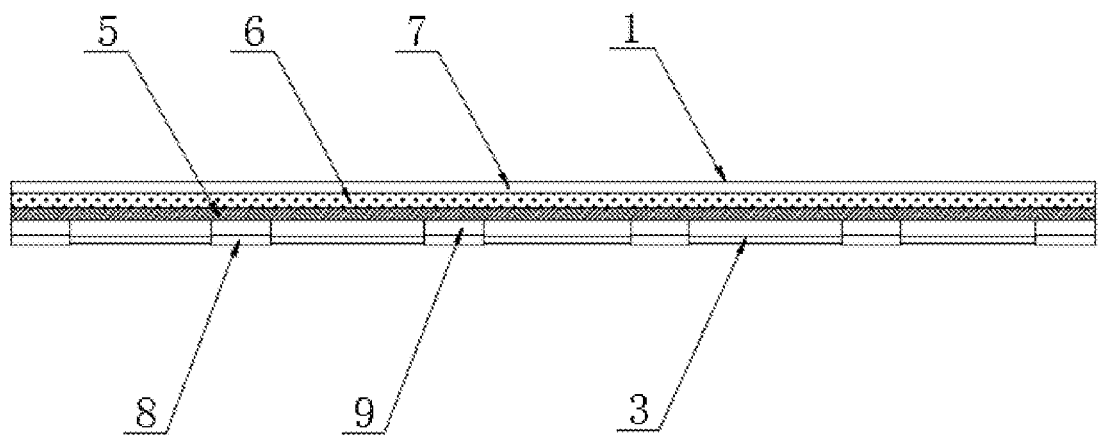
FIG. 2 is a cross-sectional view of FIG. 1 of the display screen assembly structure along line I-I.
Figure 3:
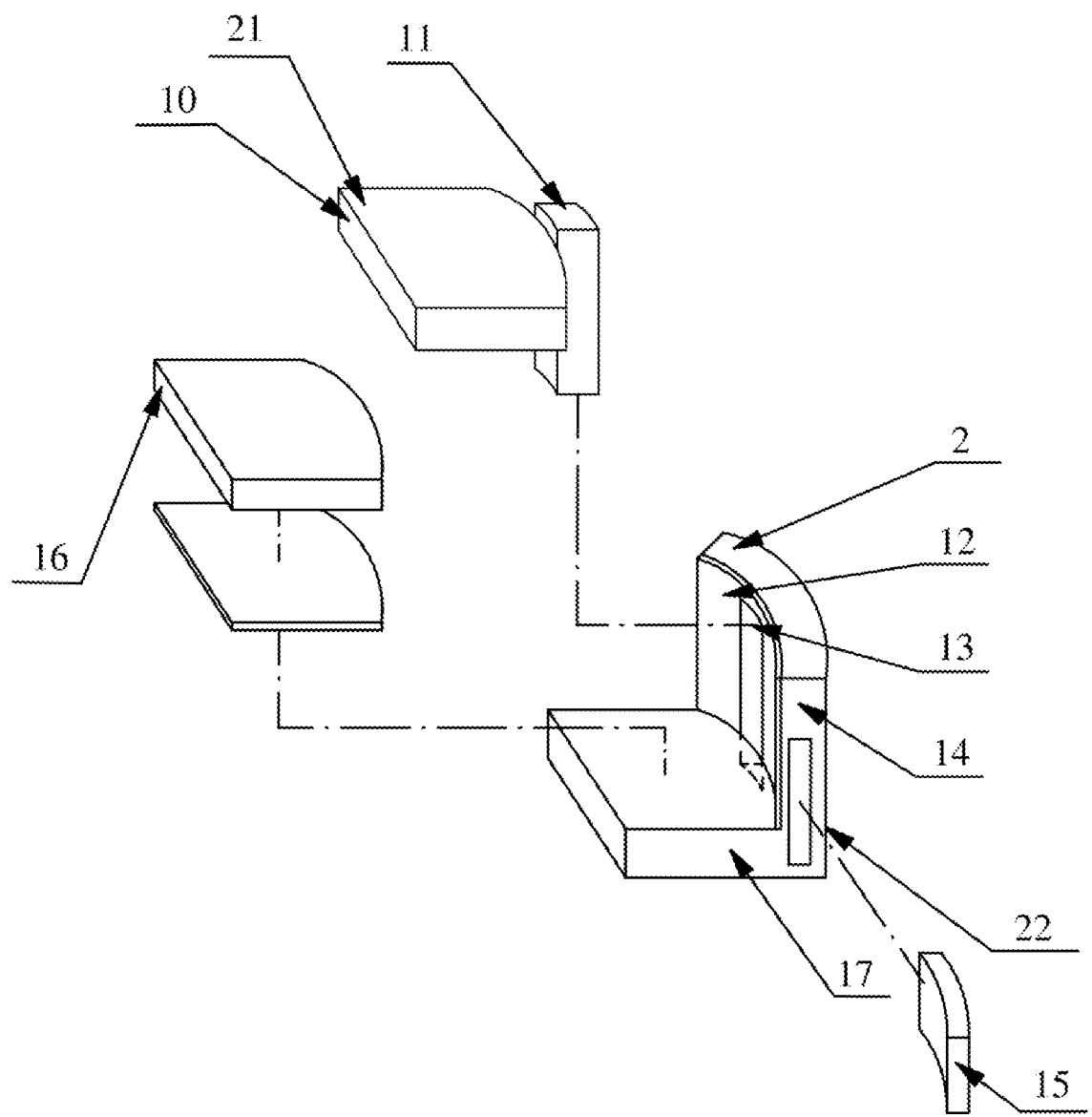
FIG. 3 is an enlarged exploded schematic view of a display screen holder in the display screen assembly structure of FIG. 1.

Referring to FIG. 1, FIG. 2 and FIG. 3, showing the display screen assembly structure according to the embodiment of the present invention includes: the display screen body 1; the display screen holder 2; an elastic member 3; and a plurality of connection holders 4. Preferably, bottom of four corner of the display screen body 1 is detachably attached to the display screen holder 2. The connection holders 4 are connected to each other by the elastic member 3. Preferably, the elastic member 3 connects the connection holder 4 and the display screen holder 2. Preferably, the elastic member 3 is a plurality of elastic rubber strips. The connection holders 4 are uniformly fixedly connected to a bottom surface of the display screen body 1. A side surface of the connection holders 4 is uniformly fixedly connected with the elastic rubber strips. Optionally, the elastic rubber strip 3 is fixed to the display screen holder 2. The elastic rubber strip 3 can provide shock absorption and rebound to the display screen body 1.

Next, as shown in FIG. 2, FIG. 2 is a cross-sectional view of the display screen assembly structure of FIG. 1 along line I-I. The display screen body 1 is composed of a tetrafluoroethylene (TFE) layer 5, a flexible substrate layer 6 and a blue light filter layer 7. A top surface of the flexible substrate layer 6 is fixedly attached with the blue light filter layer 7. A bottom surface of the flexible substrate layer 6 is fixedly attached to the tetrafluoroethylene layer 5. The connection holder 4 has a first base 8 and a second base 9. The second base 9 is fixedly adhered to the display screen body 1. Preferably, after the display screen body 1 is disassembled, the second base 9 is disassembled at the same time. In order to facilitate disassembly and installation between the first base 8 and the second base 9, the first base 8 and the second base 9 are connected by a connecting member 41. Preferably, the connecting member 41 is a screw. Preferably, the second base 9 is fixed to the tetrafluoroethylene layer 5, and a top of the first base 8 is detachably connected to the second base 9.

Please refer to FIG. 3. FIG. 3 is an enlarged schematic view of the display screen holder 2 in the display screen assembly structure of FIG. 1. The display screen holder includes: a display screen placement board 10; a fixture block 11; a cushion 12; a fixture slot 13; a buffer chamfer 14; a fluid buffer member 15; a sealing gasket 16 and a limiting block 17. The buffer chamfer 14 is formed in a sidewall of the display screen holder 2 and extending into an inside of the display screen holder 2. The fluid buffer member 15 is disposed in the buffer chamfer 14 and fixedly attached to an inner wall of the buffer chamfer 14. Preferably, the fluid buffer member 15 is a fluid buffer bag. Optionally, an internal accommodating space of the fluid buffer member 15 is filled with helium gas. Optionally, the display screen holder 2 is an arc structure to cover four corners of the display screen body 1. Optionally, the fluid buffer member 15 is an arc-shaped structure adapted to a structural design of the display screen holder 2. In order to improve waterproof performance of the display screen holder 2, a waterproof rubber pad 22 is disposed on the outer side of the display screen holder 2, so that when the display screen body 1 is connected to the display screen holder 2, moisture can be prevented from permeating from the screen holder 2 into the display screen body 1. Preferably, the fixture slot 13 is formed in a side surface of the display screen holder 2 attached with the display screen placement board 10, and the display screen placement board 10 is detachably attached to the fixture slot 13 by a fixture block 11 removably fitting into the fixture slot 13. Optionally, the cushion 12 is attached to an outer side of the display screen holder 2. Furthermore, the limiting block 17 is limiting block fixedly attached to the display screen holder 2. In addition, the sealing gasket 16 is disposed between the display screen placement board 10 and the limiting block 17, and detachably attached to the limiting block 17. In order to prevent the display screen body 1 from sliding on the display screen placement board 10, results that the display screen body 1 is difficult to be fixed, and a rubber pad 21 is covered on an outer side of the display screen placement board 10.

Figure 4:
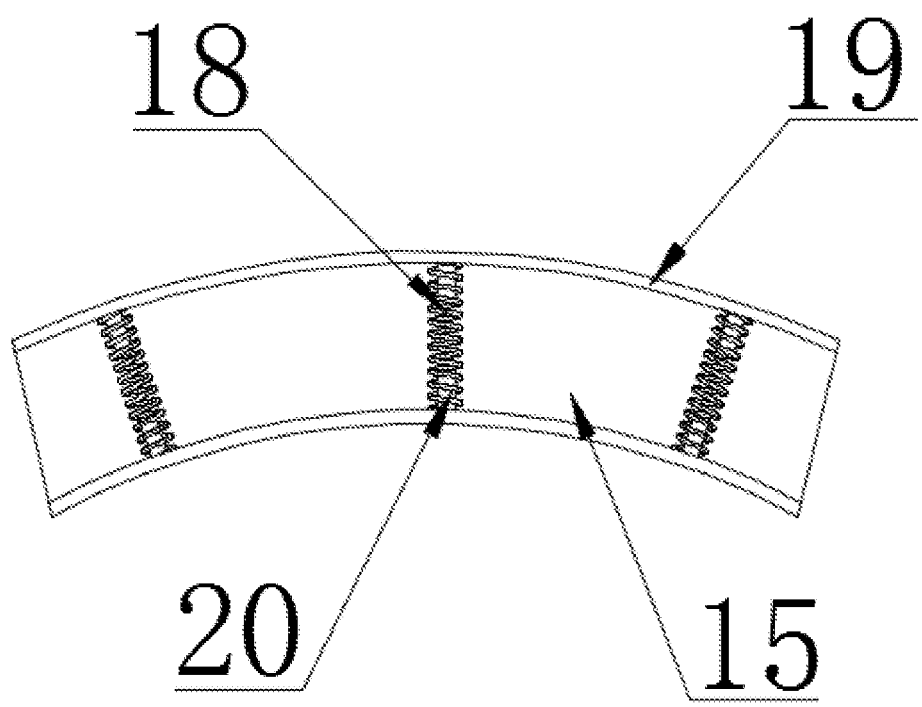
FIG. 4 is a schematic cross-sectional view of a fluid buffer member in the display screen holder of FIG. 3.

Please refer to FIG. 4. FIG. 4 is a cross-sectional view of a fluid buffer member 15 in the display screen holder of FIG. 3. The fluid buffer member 15 includes: a buffer spring 18; a dispersing plate 19 and a fixed strut 20. Two inner walls of the fluid buffering member 15 are symmetrically attached to two dispersing plates 19, one side of the two dispersing plates 19 is attached to the fixed strut 20; and the buffer spring 18 is detachably mounted on an outer side of the fixed strut 20. Preferably, in order to prevent the buffer spring 18 from touching the fixed strut 20 when the buffer spring 18 is contracting, a diameter of the fixed strut 20 is less than an inner diameter of the buffer spring 18.

When the display screen assembly structure according the embodiment of the present invention is used, the four corners of the display screen body 1 can be adhered to the display screen placement board 10 through a screen gel, and fixed the display screen body 10 to the fixing slot 13 through the fixture block 11 provided by the display screen placement board 10, so the display screen body 1 can be fixed. The first base 8 uniformly connected to the bottom surface of the display screen body 1, the display screen body 1 can be fixedly installed. If the display screen body 1 is broken, damaged, or seriously worn and needs to be replaced, it can be disassembled from the first base 8 and the second base 9, and ejects the fixture block 11 out of the fixture slot 13, thereby disassembling the display screen body 1, so that when the display screen body 1 is damaged or needs to be replaced, the display screen body 1 is rapidly disassembled and installed. The present invention reduces the required steps for maintenance staff to disassemble and install the display screen body, and lower the difficulty of disassembly and installation. When the display screen body 1 is used, the fluid buffer member 15 disposed in the buffer chamfer 14 can provide buffer protection to the display screen body 1. The impact force can be dispersed by the dispersion plate 19, and absorb the impact force through the contraction of the buffer spring 18, and in conjunction with the cushion 12 disposed on the display screen holder 2, most of the impact force generated by the collision can be absorbed. The present invention reduces the damage generated by the impact force generated by the collision on the display screen body 1, such that when a mobile device (such as a mobile phone) is dropped, the damage caused by the impact force generated by the corner of the display screen body 1 hit against the ground can be reduced, thereby increasing the protective capability. By providing the tetrafluoroethylene layer 5 in the display screen body 1 and the sealing gasket 16 disposed on the top surface of limiting block 17, it can reduce the moisture existing in the outside air permeated into the display screen body 1. By providing the blue light filter layer 7 in the display screen body 1, the radiation generated by the display screen body 1 during operation can be absorbed, thereby avoiding a large amount of radiation when the display screen body 1 runs to damage the user's eyes. The waterproof protection capability of the display screen body 1 is also increased.

The present invention further provides Furthermore, another embodiment of the present invention further provides a display screen assembly structure, including: a display screen holder detachably attached to a display screen placement board; a buffer chamfer formed in a sidewall of the display screen holder; a fluid buffer member fixedly attached to an inner wall of the buffer chamfer; and a plurality of connection holders connected to each other by an elastic member, wherein the connecting holder has a first base and a second base connected to each other by a connecting member. Two inner walls of the fluid buffering member are symmetrically attached to two dispersing plates, one side of the two dispersing plates is attached to a fixed strut; and a buffer spring is detachably mounted on an outer side of the fixed strut. A fixture slot is formed in a side surface of the display screen holder attached to the display screen placement board, and one side of the fixture slot is detachably attached to the display screen placement board by a fixture block; and a cushion is detachably attached to an outer side of the fixture slot. The connection holder has a first base and a second base connected to each other by a connecting member; and an elastic member connecting the connection holder with the display screen holder. A limiting block fixedly attached to the display screen holder; and a sealing gasket disposed between the display screen placement board and the limiting block, and detachably attached to the limiting block. Preferably, a diameter of the fixed strut is less than an inner diameter of the buffer spring, the other side surface of the display screen holder is provided with a waterproof rubber pad, and an internal accommodating space of the fluid buffer member is filled with helium gas.

As described above, compared to existing display screen assembly structure, the drawbacks are that: although it can increase the hardness of the display screen glass, to avoid the display screen being broken or damaged after the display screen is dropped. But when the display screen is dropped, it usually has a large impact force at a corner of the display screen when the corner hits against the ground, results that the display screen is broken or damaged from an edge. Moreover, the existing display screen requires professional maintenance staff to disassemble and install during disassembly and installation. The required maintenance time is long, and the maintenance cost is high. In addition, because the maintenance level of professional maintenance staff is different, and the maintenance of the OLED display screen is more difficult, it is easy to cause a problem that maintenance effectiveness of the display screens is not well. The display screen assembly structure according to the present invention provides that the display screen placement board is detachably connected to the display screen holder, and using the connection holder fixedly attached to the display screen body, facilitating to rapidly disassemble and install of the display screen body, and by providing a fluid buffer member fixedly attached to inside of the buffer chamfer and a cushion attached to a side of the display screen holder, the display screen body can be provided with a buffer protection, so as to increase the protection capability of the display screen. This not only improves the impact resistance of the display screen body, so as to increase the protection capability of the display screen, it also makes the display screen easy to disassemble and install, so as to reduce required disassembly and installation time, reduce maintenance costs, and reduce maintenance difficulty.

The present invention has been described by the above related embodiments, but the above embodiments are merely examples for implementing the present invention. It must be noted that the disclosed embodiments do not limit the scope of the invention. Conversely, modifications and equivalent arrangements are intended to be included within the scope of the invention.

What is claimed is:

1. A display screen assembly structure, comprising:
   a display screen body;
   a display screen holder detachably disposed around the display screen body;
   a display screen placement board attached to the display screen holder, and configured to dispose the display screen body thereon;
   a buffer chamfer formed in a sidewall of the display screen holder;
   a fluid buffer member fixedly attached to an inner wall of the buffer chamfer,
   wherein two inner walls of the fluid buffering member are symmetrically attached to two dispersing plates, one side of the two dispersing plates is attached to a fixed strut; and a buffer spring is mounted on an outer side of the fixed strut,
   a fixture slot formed in a side surface of the display screen holder attached with the display screen placement board, wherein the display screen placement board is attached to the fixture slot by a fixture block; and
   a cushion attached to an outer side of display screen holder.

2. The display screen assembly structure according to claim 1, wherein the display screen assembly structure further comprises:
   a connection holder fixedly attached to a bottom of the display screen body, wherein the connection holder has a first base and a second base connected to each other by a connecting member; and
   an elastic member connecting the connection holder with the display screen holder.

3. The display screen assembly structure according to claim 1, wherein the display screen assembly structure further comprises:
   a limiting block fixedly attached to the display screen holder; and
   a sealing gasket disposed between the display screen placement board and the limiting block, and attached to the limiting block.

4. The display screen assembly structure according to claim 1, wherein a diameter of the fixed strut is less than an inner diameter of the buffer spring.

5. The display screen assembly structure according to claim 1, wherein the other side surface of the display screen holder is provided with a waterproof rubber pad.

6. A display screen assembly structure, comprising:
   a display screen body;
   a display screen holder disposed around the display screen body;
   a display screen placement board attached to the display screen holder, and configured to dispose the display screen body thereon;
   a buffer chamfer formed in a sidewall of the display screen holder; and
   a fluid buffer member fixedly attached to an inner wall of the buffer chamfer, wherein a fixture slot is formed in a side surface of the display screen holder attached with the display screen placement board, and the display screen placement board is attached to the fixture slot by a fixture block.

7. The display screen assembly structure according to claim 6, wherein two inner walls of the fluid buffering member are symmetrically attached to two dispersing plates, one side of the two dispersing plates is attached to a fixed strut; and a buffer spring is mounted on an outer side of the fixed strut.

8. The display screen assembly structure according to claim 6, wherein the display screen assembly further comprises:
   a connection holder fixedly attached to a bottom of the display screen body, wherein the connection holder has a first base and a second base connected to each other by a connecting member; and
   an elastic member connecting the connection holder with the display screen holder.

9. The display screen assembly structure according to claim 6, wherein the display screen assembly structure further comprises:
   a limiting block fixedly attached to the display screen holder; and
   a sealing gasket disposed between the display screen placement board and the limiting block, and attached to the limiting block.

10. The display screen assembly structure according to claim 7, wherein a diameter of the fixed strut is less than an inner diameter of the buffer spring.

11. The display screen assembly structure according to claim 6, wherein the display screen assembly structure further comprises: a rubber pad covering an outer side of the display screen placement board.

12. The display screen assembly structure according to claim 6, wherein the other side surface of the display screen holder is provided with a waterproof rubber pad.

13. The display screen assembly structure according to claim 6, wherein an internal accommodating space of the fluid buffer member is filled with helium gas.

14. A display screen assembly structure, comprising:
   a display screen holder attached to a display screen placement board;
   a buffer chamfer formed in a sidewall of the display screen holder;
   a fluid buffer member fixedly attached to an inner wall of the buffer chamfer; and
   a plurality of connection holders connected to each other by an elastic member, wherein the connecting holder has a first base and a second base connected to each other by a connecting member.

15. The display screen assembly structure according to claim 14, wherein two inner walls of the fluid buffering member are symmetrically attached to two dispersing plates, one side of the two dispersing plates is attached to a fixed strut; and a buffer spring is mounted on an outer side of the fixed strut.

16. The display screen assembly structure according to claim 14, wherein a fixture slot is formed in a side surface of the display screen holder attached with the display screen placement board, and the display screen placement board is attached to the fixture slot by a fixture block; and a cushion is attached to an outer side of the display screen holder.

17. The display screen assembly structure according to claim 14, wherein the display screen assembly structure further comprises:
   a limiting block fixedly attached to the display screen holder; and
   a sealing gasket disposed between the display screen placement board and the limiting block, and attached to the limiting block.

18. The display screen assembly structure according to claim 14, wherein the display screen assembly structure further comprises: a rubber pad covering an outer side of the display screen placement board.

19. The display screen assembly structure according to claim 14, wherein the other side surface of the display screen holder is provided with a waterproof rubber pad.

* * * * *